(12) United States Patent
Hirler et al.

(10) Patent No.: US 10,263,086 B2
(45) Date of Patent: *Apr. 16, 2019

(54) SEMICONDUCTOR DEVICE WITH FIRST AND SECOND FIELD ELECTRODE STRUCTURES

(71) Applicant: Infineon Technologies Austria AG, Villach (AT)

(72) Inventors: Franz Hirler, Isen (DE); Martin Vielemeyer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 15/820,200

(22) Filed: Nov. 21, 2017

(65) Prior Publication Data

US 2018/0083111 A1 Mar. 22, 2018

Related U.S. Application Data

(63) Continuation of application No. 15/047,092, filed on Feb. 18, 2016, now Pat. No. 9,842,901.

(30) Foreign Application Priority Data

Mar. 5, 2015 (DE) .......................... 10 2015 103 211

(51) Int. Cl.
*H01L 21/02* (2006.01)
*H01L 29/40* (2006.01)
(Continued)

(52) U.S. Cl.
CPC ........ *H01L 29/407* (2013.01); *H01L 21/3083* (2013.01); *H01L 29/045* (2013.01);
(Continued)

(58) Field of Classification Search
CPC . H01L 29/407; H01L 21/3083; H01L 29/404; H01L 29/7811; H01L 29/7803;
(Continued)

(56) References Cited

U.S. PATENT DOCUMENTS

2006/0006386 A1* 1/2006 Hirler ................... H01L 29/404
257/60
2008/0290398 A1* 11/2008 Polishchuk ....... H01L 21/28123
257/324

(Continued)

FOREIGN PATENT DOCUMENTS

| CN | 101523582 A | 9/2009 |
|---|---|---|
| CN | 101840919 A | 9/2010 |

(Continued)

OTHER PUBLICATIONS

Office Action Communication of the German Patent and Trademark Office for File Reference 102015103211.2 dated Oct. 13, 2015.

*Primary Examiner* — Fernando L Toledo
*Assistant Examiner* — Adam S Bowen
(74) *Attorney, Agent, or Firm* — Slater Matsil, LLP

(57) ABSTRACT

A semiconductor device includes first and second field electrode structures that extend from a first surface into a semiconductor portion. The first field electrode structures include a first field dielectric insulating spicular first field electrodes against the semiconductor portion. The second field electrode structures include a second field dielectric insulating spicular second field electrodes against the semiconductor portion. The second field dielectric is thicker than the first field dielectric. Openings of the first and second field electrode structures in the first surface may be non-circular symmetric, wherein the openings of the second field electrode structures are tilted with respect to the openings of the first field electrode structures. Alternatively or in addition, (Continued)

the openings of the second field electrode structures in the first surface may be greater than the openings of the first field electrode structures.

18 Claims, 11 Drawing Sheets

(51) Int. Cl.
  *H01L 29/06* (2006.01)
  *H01L 29/04* (2006.01)
  *H01L 29/78* (2006.01)
  *H01L 21/308* (2006.01)
  *H01L 29/861* (2006.01)

(52) U.S. Cl.
  CPC ........ *H01L 29/0696* (2013.01); *H01L 29/404* (2013.01); *H01L 29/7803* (2013.01); *H01L 29/7806* (2013.01); *H01L 29/7811* (2013.01); *H01L 21/02255* (2013.01); *H01L 29/8613* (2013.01)

(58) Field of Classification Search
  CPC ............. H01L 29/0696; H01L 29/7806; H01L 29/045; H01L 21/02255
  USPC ........................................................ 257/337
  See application file for complete search history.

(56) References Cited

U.S. PATENT DOCUMENTS

| | | | |
|---|---|---|---|
| 2010/0314670 A1* | 12/2010 | Denison | .............. H01L 29/0653 257/255 |
| 2013/0137230 A1* | 5/2013 | Blank | ................... H01L 29/407 438/270 |

FOREIGN PATENT DOCUMENTS

| | | |
|---|---|---|
| CN | 103268887 A | 8/2013 |
| DE | 199 35 442 C1 | 12/2000 |
| DE | 101 27 885 A1 | 12/2002 |
| DE | 10 2004 041 198 A1 | 3/2006 |
| DE | 10 2013 106 055 A1 | 12/2013 |

* cited by examiner

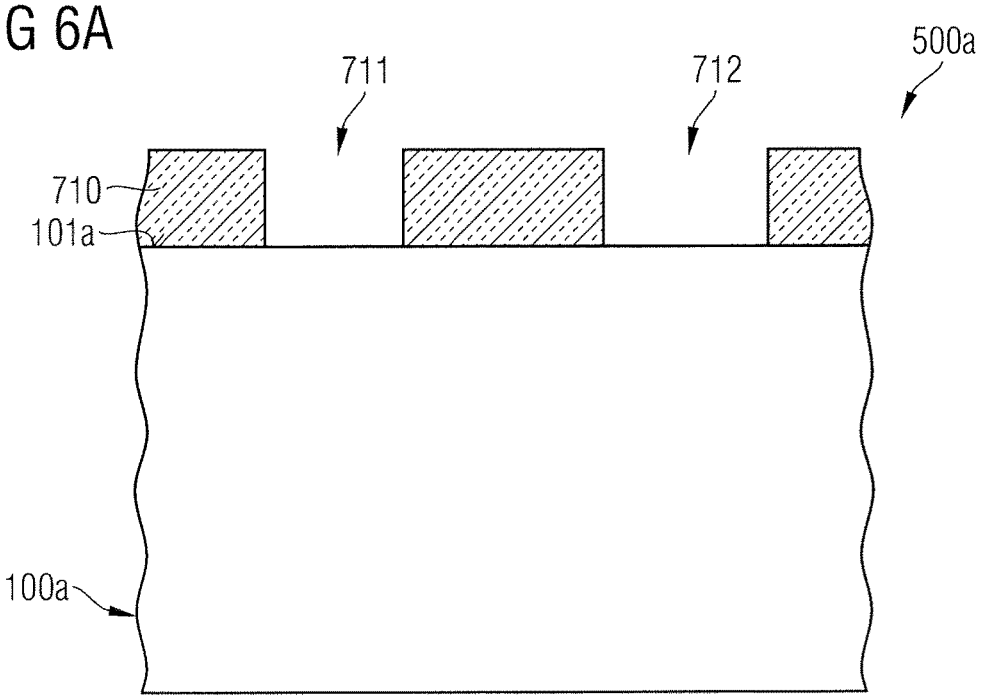
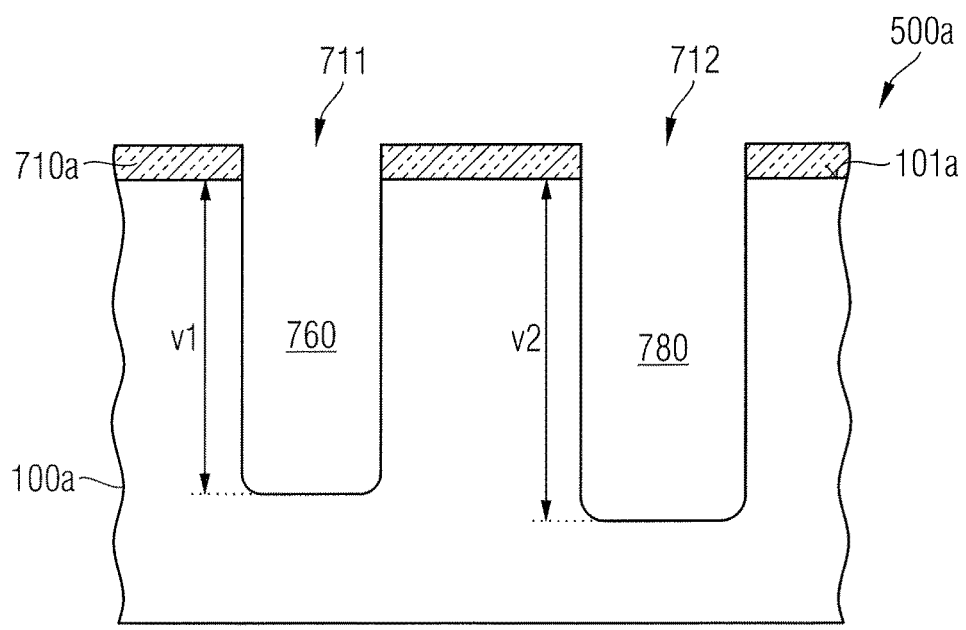

SEMICONDUCTOR DEVICE WITH FIRST AND SECOND FIELD ELECTRODE STRUCTURES

CROSS-REFERENCE TO RELATED APPLICATION

This application is a continuation of U.S. application Ser. No. 15/047,092 filed Feb. 18, 2016 entitled "Semiconductor Device with First and Second Field Electrode Structures" which claims priority to German Application Serial No. 102015103211.2 filed Mar. 5, 2015 and entitled "Semiconductor Device with First and Second Field Electrode Structures".

BACKGROUND

Power semiconductor devices, for examples IGFETs (insulated gate field effect transistors) are typically vertical devices with a load current flow between a first surface at a front side of a semiconductor die and a second surface on the back. In a blocking mode field electrode structures extending from a front side into the semiconductor die deplete a depletable portion of the semiconductor die. The field electrode structures allow high dopant concentrations in the depletable portion without adverse impact on the blocking capability. Higher dopant concentrations in the depletable portion reduce the on-state resistance of the device.

It is desirable to provide semiconductor devices with high avalanche ruggedness.

SUMMARY

According to an embodiment a semiconductor device includes first and second field electrode structures extending from a first surface into a semiconductor portion. The first field electrode structures include a first field dielectric insulating spicular first field electrodes against the semiconductor portion. The second field electrode structures include a second field dielectric insulating spicular second field electrodes against the semiconductor portion. The second field dielectric is thicker than the first field dielectric. Openings of the first and second field electrode structures in the first surface are non-circular symmetric. The openings of the second field electrodes structures are tilted to the openings of the first field electrode structures.

According to another embodiment a semiconductor device includes first and second field electrode structures extending from a first surface into a semiconductor portion. The first field electrode structures include a first field dielectric insulating spicular first field electrodes against the semiconductor portion. The second field electrode structures include a second field dielectric insulating spicular second field electrodes against the semiconductor portion. The second field dielectric is thicker than the first field dielectric. Neither openings of the second field electrode structures nor openings of the first field electrode structures in the first surface are circular symmetric. The openings of the second field electrode structures are greater than the openings of the first field electrode structures.

According to a further embodiment a semiconductor device includes first and second field electrode structures extending from a first surface into a semiconductor portion. The first field electrode structures include a first field dielectric insulating spicular first field electrodes against the semiconductor portion. The second field electrode structures include a second field dielectric insulating spicular second field electrodes against the semiconductor portion. The second field dielectric is thicker than the first field dielectric. Openings of the second field electrode structures in the first surface have a same shape as and are greater than openings of the first field electrode structures. Both the first and the second field electrode structures are formed in a transistor cell area that includes transistor cells to control a current flow through the semiconductor portion.

According to a further embodiment a method of manufacturing a semiconductor device includes forming, contemporaneously, first and second trenches extending from a process surface into a semiconductor layer, wherein a first horizontal dimension of the trenches does not exceed more than five times a second horizontal dimension orthogonal to the first horizontal direction. The semiconductor layer is heated up to form a dielectric layer with first layer portions lining the first trenches and second layer portions lining the second trenches, wherein the second layer portions are thicker than the first layer portions.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 6A is a schematic cross-sectional view of a portion of a semiconductor substrate for illustrating a method of manufacturing a semiconductor device in accordance with a further embodiment, after forming an etch mask.

FIG. 6B is a schematic cross-sectional view of the semiconductor substrate portion of FIG. 6A, after etching first and second trenches by using the etch mask.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference sign in the different drawings, respectively, if not stated otherwise.

The terms "having", "containing", "including", "comprising" and the like are open, and the terms indicate the presence of stated structures, elements or features but do not preclude additional elements or features. The articles "a", "an" and "the" may include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example resistors or elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
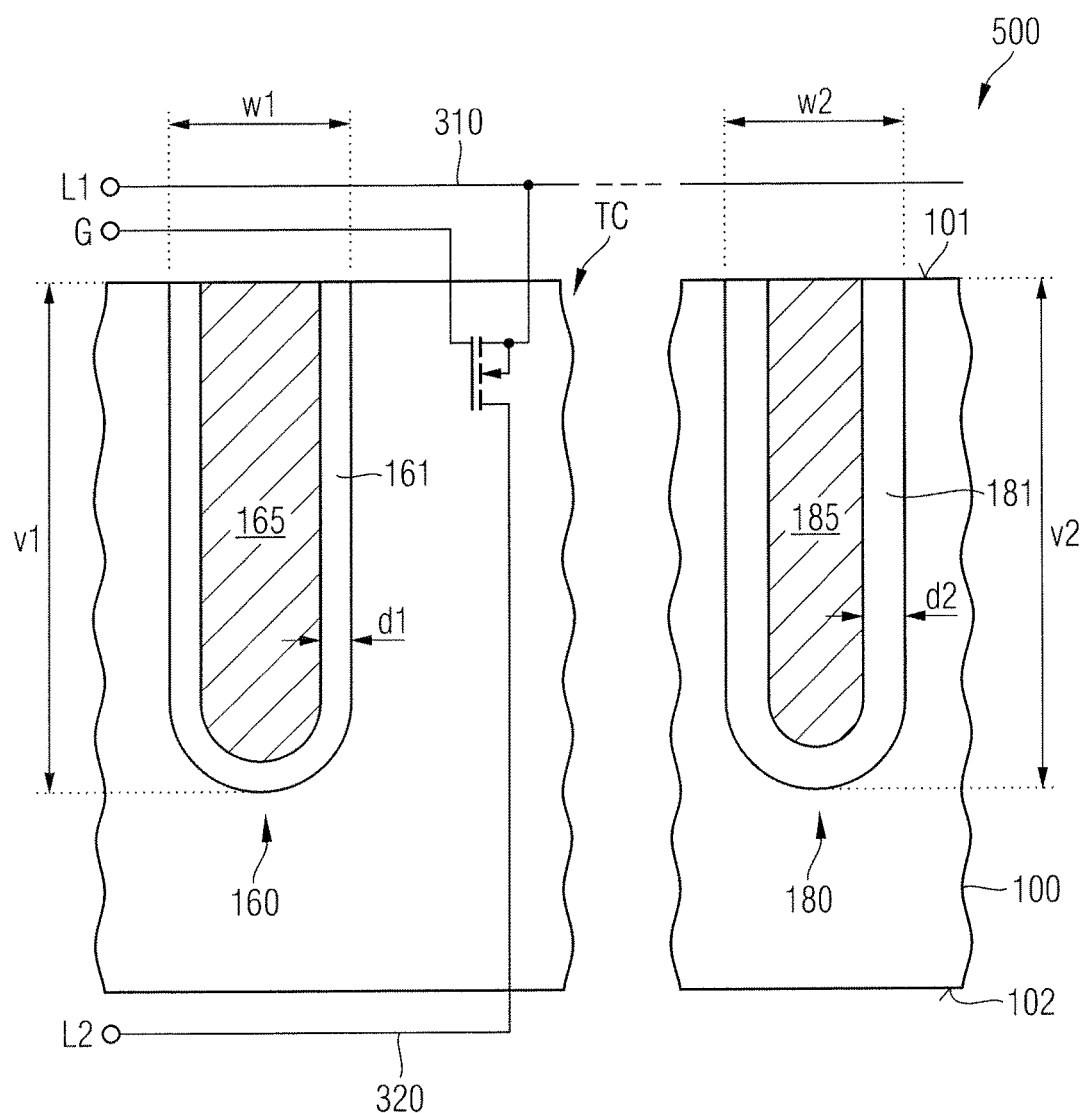
FIG. 1A is a schematic vertical cross-sectional view of portions of a semiconductor device in accordance with an embodiment with two different field electrode structures with field dielectrics of different widths.
Figure 1B:
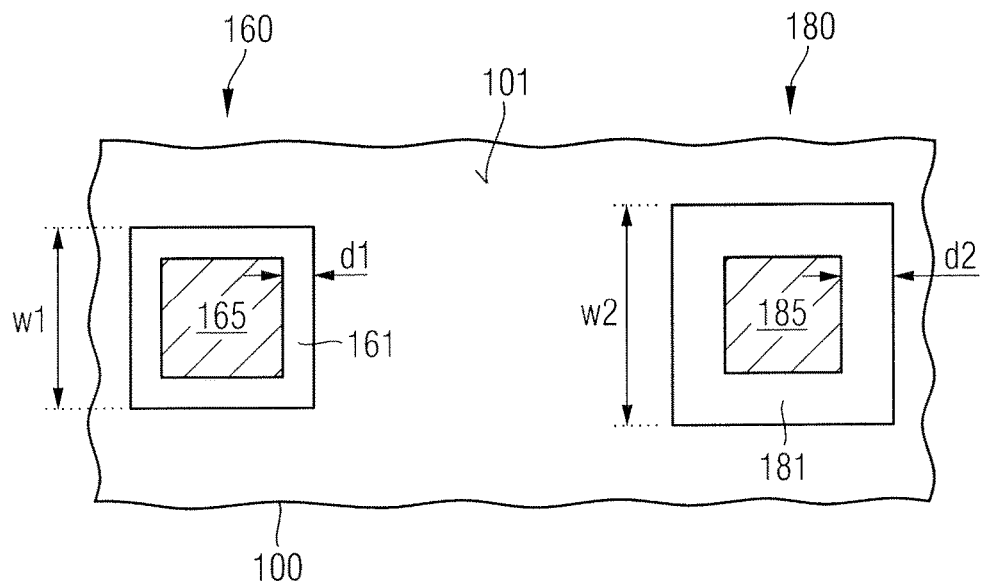
FIG. 1B is a schematic horizontal cross-sectional view through a portion of a semiconductor device including a first and a second field electrode structure according to an embodiment based on different widths of openings of the field electrode structures in a first surface of a semiconductor portion.
Figure 1C:
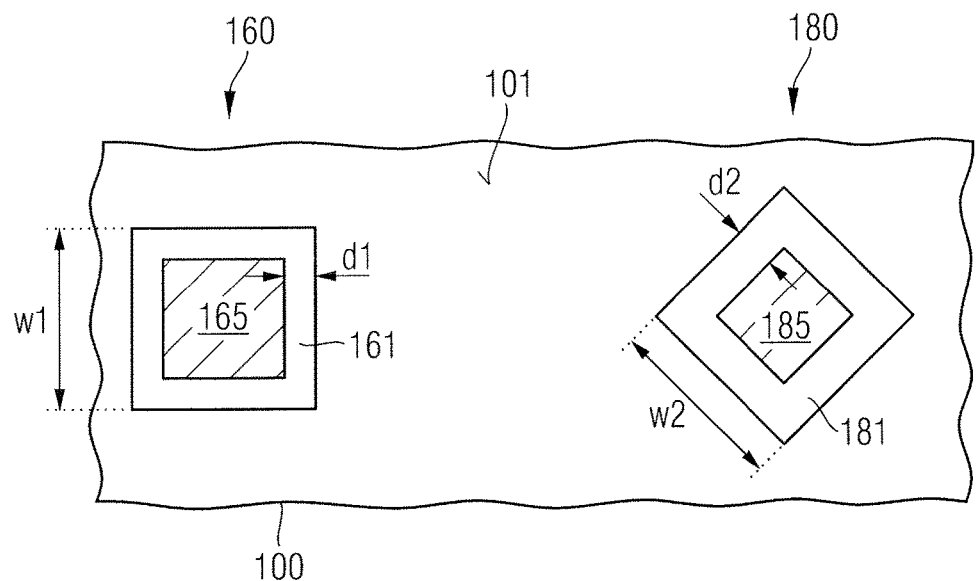
FIG. 1C is a schematic horizontal cross-sectional view of a portion of a semiconductor device including two field electrode structures with field dielectrics of different width according to an embodiment based on different orientation of openings of the first and second field electrode structures in a horizontal plane.

FIGS. 1A to 1C refer to a semiconductor device 500 including a plurality of identical transistor cells TC. The semiconductor device 500 may be or may include an IGFET, for example an MOSFET (metal oxide semiconductor FET) in the usual meaning including FETs with metal gates as well as FETs with non-metal gates. According to another embodiment, the semiconductor device 500 may be an IGBT (insulated gate bipolar transistor) or an MCD (MOS controlled diode).

The semiconductor device 500 is based on a semiconductor portion 100 from a single crystalline semiconductor material such as silicon (Si), silicon carbide (SiC), germanium (Ge), a silicon germanium crystal (SiGe), gallium nitride (GaN), gallium arsenide (GaAs) or any other $A_{III}B_V$ semiconductor.

At a front side, the semiconductor portion 100 has a first surface 101 which may be approximately planar or which may be defined by a plane spanned by coplanar surface sections. On the back of the semiconductor portion 100 a planar second surface 102 runs parallel to the first surface 101. A distance between the first and second surfaces 101, 102 is related to a voltage blocking capability of the semiconductor device 500 and may be at least 20 µm. According to other embodiments, the distance may be in the range of several hundred µm. An outer surface tilted to the first and second surfaces 101, 102 connects the first and second surfaces 101, 102.

In a plane perpendicular to the cross-sectional plane the semiconductor portion 100 may have a rectangular shape with an edge length of several millimeters. A normal to the first surface 101 defines a vertical direction and directions orthogonal to the vertical direction are horizontal directions.

The transistor cells TC control a load current flowing in a vertical direction between the first surface 101 and the second surface 102. The transistor cells TC may be field effect transistor cells with insulated gate. Source electrodes of the transistor cells TC may be electrically connected to a first load electrode 310 at the front side of the semiconductor device 500. The first load electrode 310 may form or may be electrically connected or coupled to a first load terminal L1. Drain electrodes of the transistor cells TC may be electrically connected to a second load electrode 320 on the back of the semiconductor device 500. The second load electrode 320 may form or may be electrically coupled or connected to a second load terminal L2. Gate electrodes of the transistor cells TC are electrically connected or coupled to a gate terminal G.

First and second field electrode structures 160, 180 extend from the first surface 101 into the semiconductor portion 100. A first vertical extension v1 of the first field electrode structures 160 may be equal to or smaller than a second vertical extension v2 of the second field electrode structures 180. The vertical extensions v1, v2 may be in a range from 0.5 µm to 20 µm, e.g. in a range from 5 µm to 10 µm.

Vertical sections of the first and second field electrode structures 160, 180 between the first surface 101 and buried end portions may have approximately vertical sidewalls or may slightly taper at a taper angle of, e.g., about one degree with respect to the vertical direction. Sidewalls of the first and second field electrode structures 160, 180 may be straight or slightly bulgy. The end portions of the first and second field electrode structures 160, 180 may include flat portions parallel to the first surface 101 or may be approximately semi-circular.

The first field electrode structures 160 include first field electrodes 165 and a first field dielectric 161 insulating the first field electrode 165 from the semiconductor portion 100. The second field electrode structures 180 include second field electrodes 185 and a second field dielectric 181 insulating the second field electrodes 185 against the semiconductor portion 100.

The first and second field electrodes 165, 185 include or consist of a heavily doped polycrystalline silicon material and/or a metal containing material.

The first and second field dielectrics 161, 181 separate the field electrodes 165, 185 from the surrounding semiconductor material of the semiconductor portion 100 and include or consist of a dielectric layer resulting from a thermal oxidation or nitridation of the semiconductor material of the semiconductor portion 100, e.g., a semiconductor nitride layer, a semiconductor oxide layer or a semiconductor oxynitride layer. In addition to the dielectric layer, the first and second field dielectrics 161, 181 may include further layers of dielectric materials such as deposited semiconductor oxide, for example, deposited silicon oxide such as silicon oxide formed by using TEOS (tetraethyl orthosilicate) as precursor material.

The first and second field electrodes 165, 185 are spicular (needle-shaped), wherein a second horizontal dimension exceeds a first horizontal dimension orthogonal to the second horizontal dimension by at most 500% and the vertical extension v1, v2 exceeds the second horizontal dimension. According to an embodiment the second horizontal dimension exceeds the first horizontal dimension by at most 100% and the vertical extension v1, v2 exceeds the second horizontal dimension by at least 100%.

Horizontal cross-sections of the first and second field electrodes 165, 185 as well as cross-sections of the first and second field electrode structures 160, 180 may be elongated, wherein the second horizontal dimension exceeds the first horizontal dimension by at least 20%, e.g., at least 50%. For example, the cross-sections may be ellipses, ovals, non-square rectangles or distorted polygons with or without rounded or beveled corners, respectively.

According to another embodiment, the first and second horizontal dimensions are approximately equal and the cross-sections of the first and second field electrodes 165, 185 as well as the cross-sections of the first and second field electrode structures 160, 180 are rotational symmetric and look the same after a rotation by at least one rotation angle smaller than 360 degree. For example, the cross-sections are regular polygons such as octagons, hexagons or squares, with or without rounded or beveled corners, respectively. According to another embodiment, the cross-sections of the first and second field electrodes 165, 185 as well as the first and second field electrode structures 160, 180 are rotational symmetric but not circular symmetric.

Each first field electrode structure 165 may be assigned to and may form part of a transistor cell TC. The second field electrode structures 180 may or may not be assigned to transistor cells TC.

The first and second field electrode structures 160, 180 may integrate the gate electrode of the transistor cell TC it is assigned to, wherein the first and second field electrode structures 160, 180 further comprise a gate dielectric, wherein the first and second field electrodes 165, 185 are electrically connected or coupled to the gate terminal G and first portions of at least the first field electrodes 165 are effective as gate electrodes of the transistor cells TC and second portions as field electrodes.

According to other embodiments, the first and second field electrode structures 160, 180 are field electrode structures without gate functionality, wherein the first and second field electrodes 165, 185 are electrically connected to the first load terminal L1 or to another network node of the semiconductor device 500, wherein during operation of the semiconductor device the network node supplies a potential different from the potential applied to the gate terminal G. For example, the first and second field electrodes 165, 185 may be electrically connected to an output of an internal driver circuit, to an auxiliary terminal, or to an internal voltage source.

The second field dielectric 181 has a thickness d2 which is greater than a thickness d1 of the first field dielectric 161. The difference in thickness results from different oxidation rates when forming the dielectric layer that incorporates material from the semiconductor portion 100. The different oxidation rates may result from a wider width w2 of the second field electrode structures 180 with respect to a width w1 of the first field electrode structures 160 or from different orientations of sidewalls of the first and second field electrode structures 160, 180 with respect to crystal planes in the semiconductor portion 100.

The second field electrode structures 180 with thick second field dielectric 185 may be used to locally reduce the electric field strength and to locally increase the breakdown voltage in the concerned regions of the semiconductor portion 100.

For example, second field electrode structures 180 may increase a breakdown voltage of an edge area without transistor cells TC with respect to a breakdown voltage of a transistor cell area including transistor cells TC and first field electrode structures 160. As a consequence, an avalanche breakdown mainly takes place in and distributes over the comparatively large transistor cell area instead over the comparatively narrow edge area. The avalanche breakdown concerns larger regions of the semiconductor portion 100 and thermal stress more evenly distributes over the semiconductor portion 100.

According to other embodiments, the thick second field dielectrics 181 may locally increase a breakdown voltage within a transistor cell area in order to shield further integrated electronic elements such as Schottky diodes, MCDs, current sense elements or temperature sense elements against thermal stress caused by an avalanche breakdown in vicinity of the integrated electronic element.

Since different dielectric widths are formed without additional photomask or other patterning processes, the local variation of avalanche breakdown strength can be achieved without additional costs.

FIG. 1B refers to an embodiment with the openings of the first field electrode structures 160 forming squares with a first edge length w1. Openings of the second field electrodes 180 in the first surface 101 are squares with a second edge length w2 exceeding the first edge length w1 by at least 10%. A second thickness d2 of the second field dielectric 181 exceeds a first thickness d1 of the first field dielectric 161 by at least 5%, e.g., by a least 10% as a result of a higher oxidation rate in wide trenches than in narrow trenches.

FIG. 1C refers to an embodiment with a first edge length w1 of a square opening of the first field electrode structures 160 being approximately equal to a second edge length w2 of a square opening of the second field electrode structures 180.

The opening of the second field electrode structure 180 is tilted with respect to the openings for the first field electrode structures 160. A tilt angle is selected such that sidewalls of the second field electrode structures 180 are formed by other crystal planes than sidewalls of the first field electrode structures 160 and may depend on the semiconductor material.

According to an embodiment, the semiconductor material of the semiconductor portion 100 has a cubic crystal lattice, e.g., the semiconductor material is silicon, wherein the sidewalls of the first field electrode structures (160) are {100} crystal planes and the sidewalls of the second field electrode structures (180) are {110} crystal planes, which are tilted to the {100} crystal planes by 45 degree. A second thickness d2 of the second field dielectric 181 exceeds a first thickness d1 of the first field dielectric 161 by at least 5%, e.g., at least 10% as a result of different oxidation rates on different types of crystal planes. The embodiments of FIGS. 1B and 1C may be combined with each other.

Figure 2A:
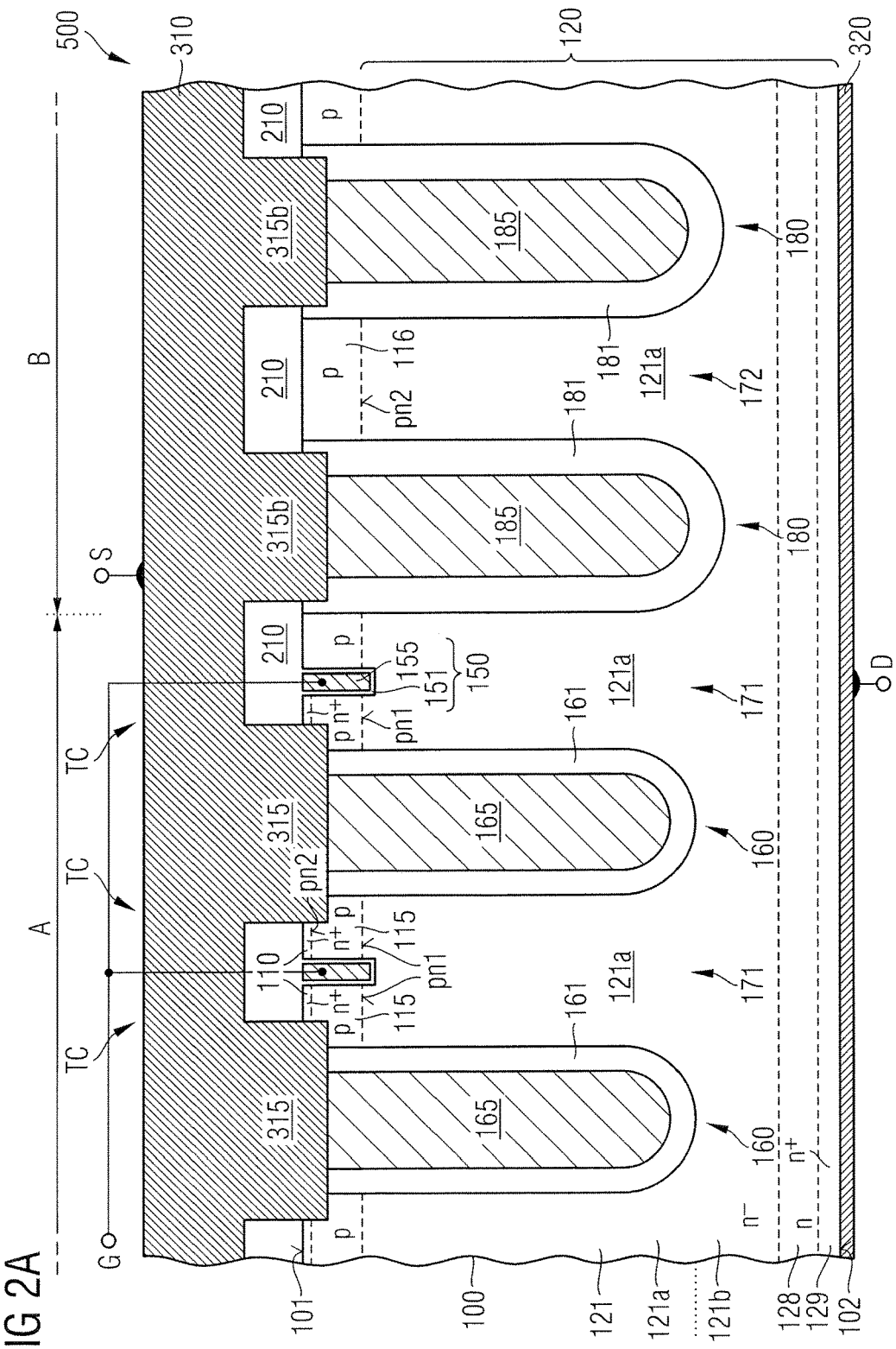
FIG. 2A is a schematic vertical cross-sectional view of a portion of a semiconductor device with trench gates in accordance with an embodiment related to first and second field electrode structures formed in different regions.

In FIG. 2A the semiconductor device 500 is an IGFET with first field electrodes 160 based on the first field electrodes 160 of FIG. 1A in a first region A and second field electrode structures 180 based on the second field electrodes 180 of FIG. 1A in a second region B, wherein the first and second field electrode structures 160, 180 extend from a first surface 101 into a semiconductor portion 100 as described with reference to FIG. 1A.

The semiconductor portion 100 includes a drain structure 120 of a first conductivity type. The drain structure 120 is effective as drain electrode of the transistor cells TC and is electrically connected to the second load electrode 320. The drain structure 120 includes a drift zone 121, in which a dopant concentration may gradually or in steps increase or decrease with increasing distance to the first surface 101 at least in portions of its vertical extension. According to other embodiments, the dopant concentration in the drift zone 121 may be approximately uniform. A mean dopant concentration in the drift zone 121 may be between $1E15$ cm$^{-3}$ and $1E17$ cm$^{-3}$, for example in a range from $5E15$ cm$^{-3}$ to $5E16$ cm$^{-3}$.

The drain structure 120 further includes a contact portion 129, which may be a heavily doped base substrate or a heavily doped layer. Along the second surface 102 a dopant concentration in the contact portion 129 is sufficiently high to form an ohmic contact with a metal directly adjoining the second surface 102. In case the semiconductor portion 100 is based on silicon, in an n-conductive contact portion 129 the dopant concentration along the second surface 102 may be at least $1E18$ cm$^{-3}$, for example at least $5E19$ cm$^{-3}$. In a p-conductive contact portion 129, the dopant concentration may be at least $1E16$ cm$^{-3}$, for example at least $5E17$ cm$^{-3}$.

The drain structure 120 may include further doped zones, for example a field stop layer 128 sandwiched between the drift zone 121 and the contact portion 129. A mean dopant concentration in the field stop layer 128 may be at least five times as high as a mean impurity concentration in the drift zone 121 and may be at most one fifth of a maximum dopant concentration in the contact portion 129.

First drift zone sections 121a and further semiconducting portions of the transistor cells TC are formed in active mesa sections 171 formed from sections of the semiconductor portion 100 between the first and second field electrode structures 160, 180, wherein the active mesa sections 171 directly adjoin at least one of the first field electrode structures 160. The active mesa sections 171 may surround the respective first field electrode structure 160 and protrude from a contiguous section of the semiconductor portion 100 below the first and second field electrode structures 160, 180.

The first drift zone sections 121a directly adjoin a contiguous drift zone section 121b formed in the contiguous section of the semiconductor portion 100. In each active mesa section 171, the respective first drift zone section 121a forms a first pn junction pn1 with a body zone 115 that forms one or more second pn junctions pn2 with one or more source zones 110 formed between the body zone 115 and the first surface 101. The body zone 115 of a transistor cell TC completely surrounds the respective field electrode structure 160 in the horizontal plane.

The source zones 110 may be wells extending from the first surface 101 into the semiconductor portion 100, for example into the body zones 115. According to an embodiment, one source zone 110 surrounds a first field electrode structure 160 of the concerned transistor cell TC in a horizontal plane. The source zone(s) 110 may directly adjoin the first field first electrode structure 160 or may be spaced from the first field electrode structure 160. According to other embodiments, the first field electrode structure 160 of the transistor cell TC is not completely surrounded by one source zone 110 or includes several spatially separated source zones 110 arranged rotational symmetrically.

An outer contour line of a horizontal cross-sectional area of the active mesa section 171 may be a circle, an ellipse, an oval or a polygon, i.e. an octagon, a hexagon or a square with or without rounded corners, respectively. An inner contour line of the active mesa section 171 is defined by the contour of the field electrode structure 160 in the horizontal plane. A horizontal mean width of the active mesa section 171 may be in a range from 0.2 µm to 10 µm, for example in a range from 0.3 µm to 1 µm.

A gate structure 150 includes a conductive gate electrode 155 and may surround the field electrode structure 160 in a horizontal plane within or outside the active mesa section 171. According to the illustrated embodiment, the gate structures 150 extend into the active mesa sections 171, which in turn surround the first field electrode structures 160. The gate electrode 155 includes or consists of a heavily doped polycrystalline silicon layer and/or a metal-containing layer.

The gate electrode 155 is completely insulated against the semiconductor portion 100, wherein a gate dielectric 151 separates the gate electrode 155 at least from the body zones 115. The gate dielectric 151 capacitively couples the gate electrode 155 to channel portions of the body zones 115. The gate dielectric 151 may include or consist of a semiconductor oxide, for example thermally grown or deposited silicon oxide, semiconductor nitride, for example deposited or thermally grown silicon nitride, a semiconductor oxynitride, for example silicon oxynitride, or a combination thereof.

The gate structure 150 may be a planar gate formed outside the semiconductor portion 100 along the first surface 101. According to the illustrated embodiment the gate structure 150 is a trench gate extending from the first surface 101 into the semiconductor portion 100.

In the illustrated embodiments and for the following description, the source zones 110 and the drift zones 121 are n-type and the body zones 115 are p-type. Similar considerations as outlined below apply to embodiments with p-type source zones 110 and drift zones 121 and with n-type body zones 115.

When a voltage applied to the gate electrode 150 exceeds a preset threshold voltage, electrons accumulate in the channel portions of the body zones 115 directly adjoining the gate dielectric 151 and form inversion channels allowing a unipolar charge carrier flow through the second pn junctions pn2.

A vertical extension of the gate structures 150 is smaller than the vertical extension of the first and second field electrode structures 160, 180. The vertical extension of the gate structures 150 may be in a range from 100 nm to 5000 nm, for example in a range from 300 nm to 1000 nm.

According to the illustrated embodiment the gate structures 150 surround the active mesa sections 171, such that the first field electrode structures 160 and the gate structures 150 sandwich a portion of the interjacent active mesa section 171 with the source and body zones 110, 115. According to other embodiments, the gate structure 150 may be formed between the active mesa sections 171 and the first field electrode structures 160.

The transistor cells TC may be centered on a vertical axis of the first field electrode structures 160 and may be arranged matrix-like in lines and rows. According to other embodiments, the transistor cells TC may be arranged in shifted lines, wherein odd lines may be shifted with respect to even lines by half the distance between two transistor cells TC along the line.

In further mesa sections 172 between neighboring second field electrode structures 180 or directly adjoining at least one of the second field electrode structures 180, no transistor cells TC are formed that conduct a portion of the load current in the on-state. Instead, the further mesa sections 172 may include doped regions forming other electronic elements. The further mesa sections 172 may be electrically connected to the first load electrode 310 or may be insulated from the first load electrode 310.

An interlayer dielectric 210 on the first surface 101 may insulate the gate electrodes 155 and some or all of the further mesa sections 172 against the first load electrode 310 provided at the front side. The interlayer dielectric 210 may include one or more dielectric layers from silicon oxide, silicon nitride, silicon oxynitride, doped or undoped silicate glass, for example BSG (boron silicate glass), PSG (phosphorus silicate glass) or BPSG (boron phosphorus silicate glass), by way of example.

The first load electrode 310 may form or may be electrically coupled or connected to the source terminal S. The second load electrode 320, which directly adjoins the second surface 102 and the contact portion 129, may form or may be electrically connected to the drain terminal D.

Each of the first and second load electrodes 310, 320 may consist of or contain, as main constituent(s), aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), tin (Sn), titanium (Ti), tungsten (W), tantalum (Ta), vanadium (V), silver (Ag), gold (Au), platinum (Pt), and/or palladium (Pd). For example, at least one of the first and second load electrodes 310, 320 may include two or more sub-layers, wherein each sub-layer contains one or more of Ni, Sn, Ti, V, Ag, Au, Pt, W, and Pd as main constituent(s), e.g., a silicide, a nitride and/or an alloy.

Contact structures 315 extend through openings in the interlayer dielectric 210 and electrically connect the first load electrode 310 with the first field electrodes 165, the source zones 110 and the body zones 115 of the transistor cells TC. Ancillary contact structures 315b may electrically connect the first load electrode 310 with the second field electrodes 185 and may also connect the first load electrode 310 with doped regions in the further mesa sections 172 between the second field electrode structures 180. The contact structures 315, 315b may include one or more conductive metal containing layers based on, e.g., titanium (Ti) or tantalum (Ta) and a metal fill portion, e.g., based on tungsten (W). According to other embodiments the contact structures 315, 315b include heavily doped semiconductor structures, e.g., heavily n-doped polycrystalline structures or heavily p-doped columnar structures.

The thinner first field dielectric 161 pins an avalanche breakdown in the first region A, whereas the thicker second field dielectric 181 avoids an avalanche breakdown in the second region B.

According to an embodiment, the first region A is a transistor cell region including transistor cells TC for controlling a load current flowing between the source terminal S and the drain terminal D, whereas the second region B is an edge region between the first region A and an outer surface (lateral surface) of the semiconductor portion 100, wherein the edge region is devoid of transistor cells TC. The further mesa sections 172 may be without connection to the first load electrode 310. According to other embodiments, the further mesa sections 172 include diode regions 116 forming further second pn junctions with the drain structure 120 and ohmic contacts with the first load electrode 310. Since avalanche breakdown is pinned in the transistor cell region, the avalanche breakdown distributes over a greater area and heats up the semiconductor portion 100 more uniformly.

According to another embodiment, the first region A is a first area within a transistor cell area and the second region B is a second area in the transistor cell area and embedded by the first area. The first area includes transistor cells TC. The second area may include one or more further electronic elements EE that do not contribute to a controllable load current flow through the semiconductor device 500. The further electronic elements EE may be transistor cells with at least one of the source and drain electrodes separated from the respective source or drain electrodes of the transistor cells TC, for example a current sense transistor cell or a temperature sense transistor cell or another electronic element such as a Schottky diode or an MCD. Since avalanche breakdown is pinned in the first area, the avalanche breakdown does not affect the functionality of the further electronic elements EE in the second area.

Figure 2B:
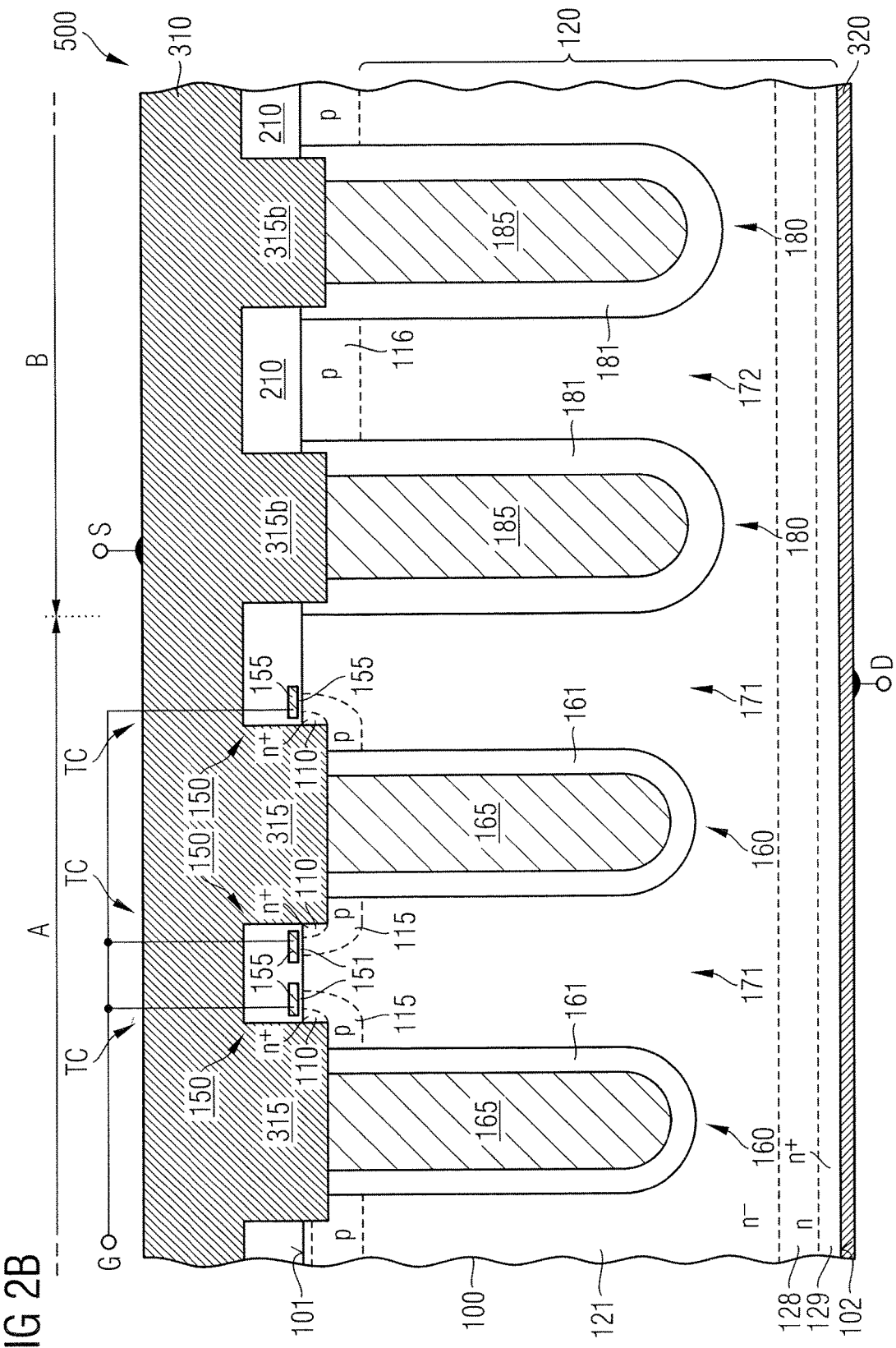
FIG. 2B is a schematic vertical cross-sectional view of a portion of a semiconductor device with planar gates in accordance with another embodiment.

The semiconductor device 500 illustrated in FIG. 2B includes planar gate electrode structures 150 with the gate dielectrics 151 formed on the first surface 101 and the gate electrodes 155 formed outside the contour of the semiconductor portion 100. The drain structure 120 extends to the first surface 101 and an inversion channel is formed parallel to and along the first surface 101.

Figure 2C:
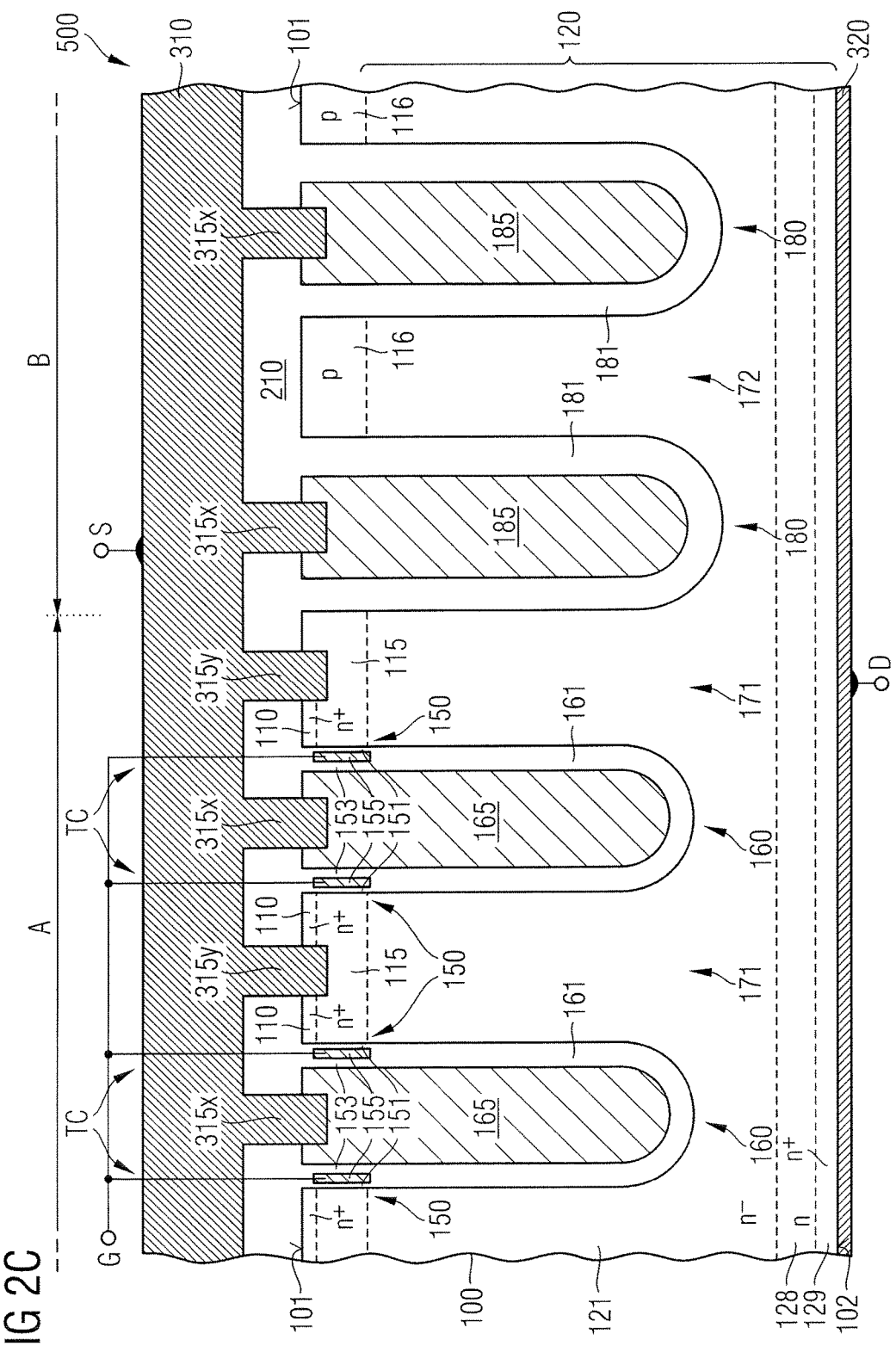
FIG. 2C is a schematic vertical cross-sectional view of a portion of a semiconductor device with trench gate electrodes integrated in field electrode structures in accordance with a further embodiment.

In FIG. 2C the semiconductor device 500 includes trench gate electrode structures 150 with gate dielectrics 151 and gate electrodes 155 integrated in at least the first field electrode structures 160. The second field electrode structures 180 may include or may be devoid of gate electrode structures 150. The gate electrode structures 150 replace an upper section of the first field dielectric 161, wherein the upper section adjoins the source zones 110 and the body zones 115 and may overlap with the drift zone 121 by some nanometers. A separation dielectric 155 is sandwiched between the gate electrode 155 and the first field electrode 165.

Electrode contact structures 315x extend through openings in the interlayer dielectric 210 and electrically connect the first load electrode 310 with the first and second field electrodes 165, 185. Mesa contact structures 315y extend through further openings in the interlayer dielectric 210 and electrically connect the first load electrode 310 with the source and body zones 110, 115.

Figure 2D:
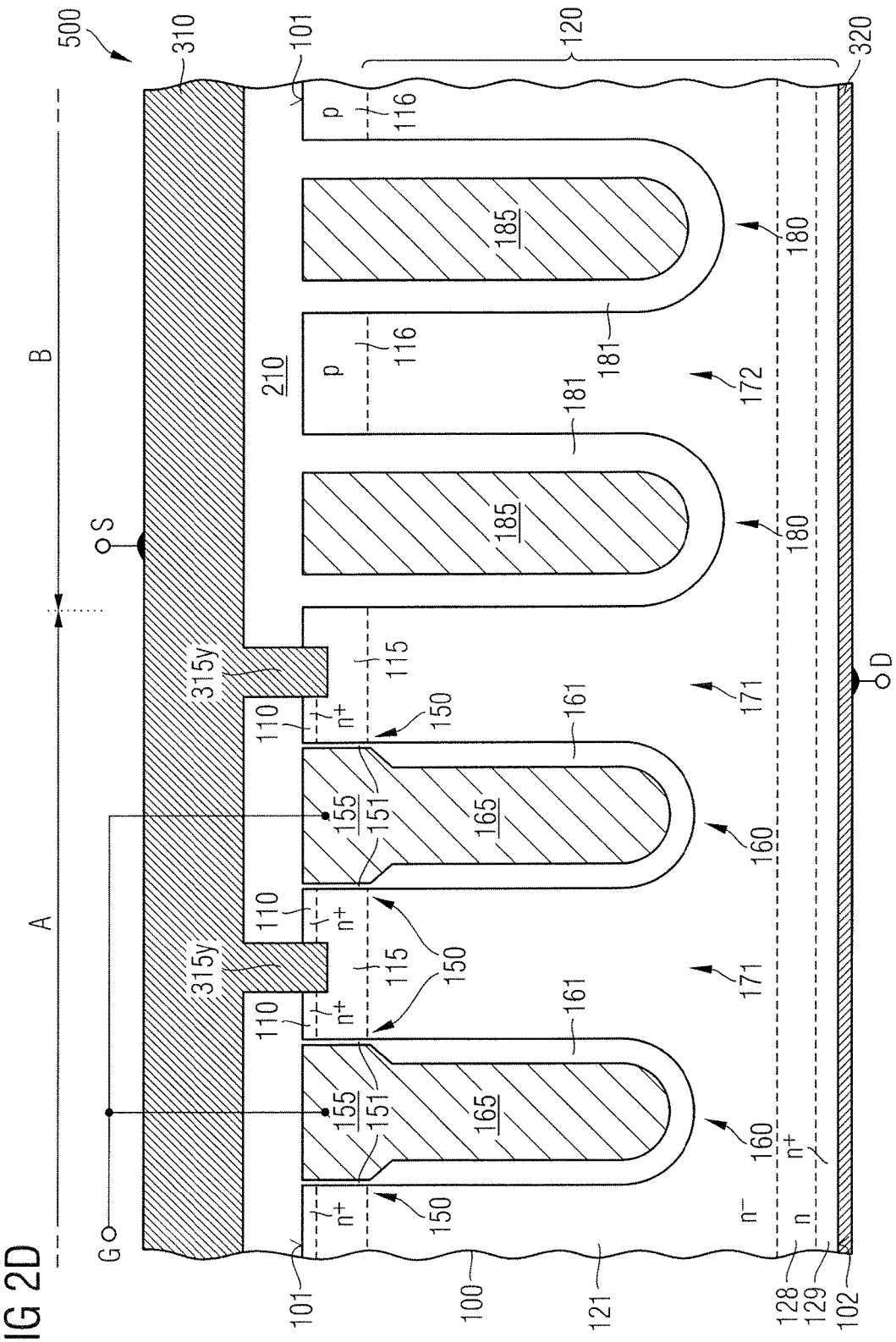
FIG. 2D is a schematic vertical cross-sectional view of a portion of another semiconductor device with gate electrode structures integrated in field electrode structures in accordance with a further embodiment.

FIG. 2D concerns a further semiconductor device 500 which gate electrode structures 150 with gate dielectrics 151 and gate electrodes 155 are integrated in at least the first field electrode structures 160. Again, the second field electrode structures 180 may include or may be devoid of gate electrode structures 150. The first field electrode 165 is formed in a first vertical section of the first field electrode structures 160 oriented to the second surface 102. The gate electrode 155 is formed in a second vertical section of the first field electrode structures 160 between the first surface 101 and the first vertical section. The gate electrode 155 and the first field electrode 165 directly adjoin to each other and emerge from the same material(s) and deposition processes. The first field dielectric 161 is formed in the first vertical section of the first field electrode structures 160 along the first field electrode 165. The gate dielectric 151 is formed in the second vertical section of the first field electrode structures 160 between the gate electrode 155 and the body zones 115 and may overlap with the source zones 110 and the drain structure 120. Both the gate electrode 155 and the first field electrode 165 are electrically coupled or connected to the gate terminal G. The second field electrodes 185 may be electrically coupled or connected to the source terminal S or to the gate terminal G. For further details reference is made to the description of FIGS. 2A and 2C.

Figure 3:
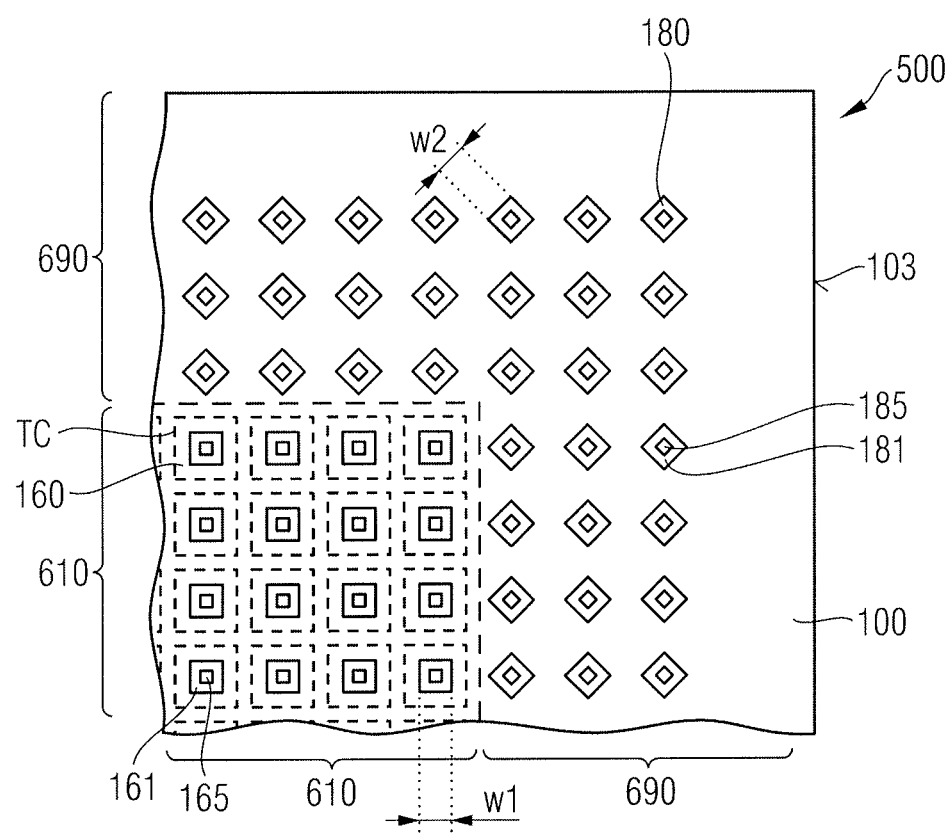
FIG. 3 is a schematic horizontal cross-sectional view of a portion of a semiconductor device according to an embodiment related to thick field dielectrics in an edge region.

FIG. 3 is a schematic horizontal cross-sectional view of a semiconductor portion 100 of a semiconductor device 500 parallel to the first surface.

Transistor cells TC, through which a load current flows in an on-state of the semiconductor device 500, and first field electrode structures 160 are arranged matrix-like in lines and columns in a transistor cell area 610. The horizontal cross-sections of the first field electrode structures 160 may be elongated or at least non-circular rotational symmetric. In the illustrated embodiment, the horizontal cross-sections of the first field electrode structures 160 are squares with a first edge length w1, wherein sidewalls of the first field electrode structures 160 are {100} crystal planes.

An edge area 690, which is devoid of transistor cells through which a load current flows in an on-state of the semiconductor device 500, surrounds the transistor cell area 610 and separates the transistor cell area 610 from an outer surface 103 of the semiconductor portion 100. Horizontal cross-sections of second field electrode structures 180 arranged in the edge area 690 are also squares with a second edge length w2 approximately equal to w1. The center points of the second field electrode structures 180 may continue the lines and rows along which center points of the first electrode structures 160 are placed. Sidewalls of the second field electrode structures 180 are {110} crystal planes. First field electrodes 165 in the first field electrode structures 160 as well as second field electrodes 185 in the second field electrode structures 180 are spicular. Due to different oxidation rates on {100} and {110} crystal planes the second field dielectrics 181 are thicker than the first field dielectrics 161 and avalanche breakdown in pinned within the transistor cell area 610.

Figure 4A:
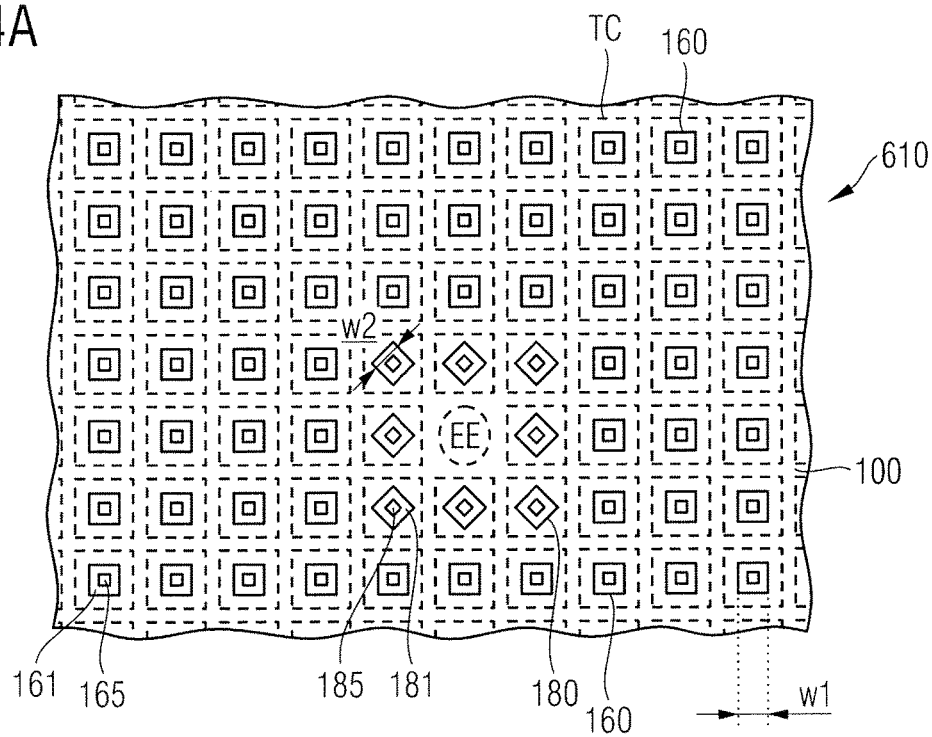
FIG. 4A is a schematic horizontal cross-sectional view of a portion of a semiconductor device according to an embodiment related to thick field dielectrics and uniform field electrode structure widths within a transistor cell area.

In FIG. 4A the second field electrode structures 180 are formed within the transistor cell area 610. The second field electrode structures 180 may be or may not be assigned to transistor cells TC. Further electronic elements EE different from the transistor cells TC may be formed in the vicinity of or between neighboring ones of the second field electrode structures 180. The thicker second field dielectrics 181 reduce the electric field strength in neighboring mesa sections such that no avalanche breakdown occurs in the direct vicinity of the further electronic elements EE. Operation of the further electronic elements EE remains unaffected by the avalanche breakdown.

Figure 4B:
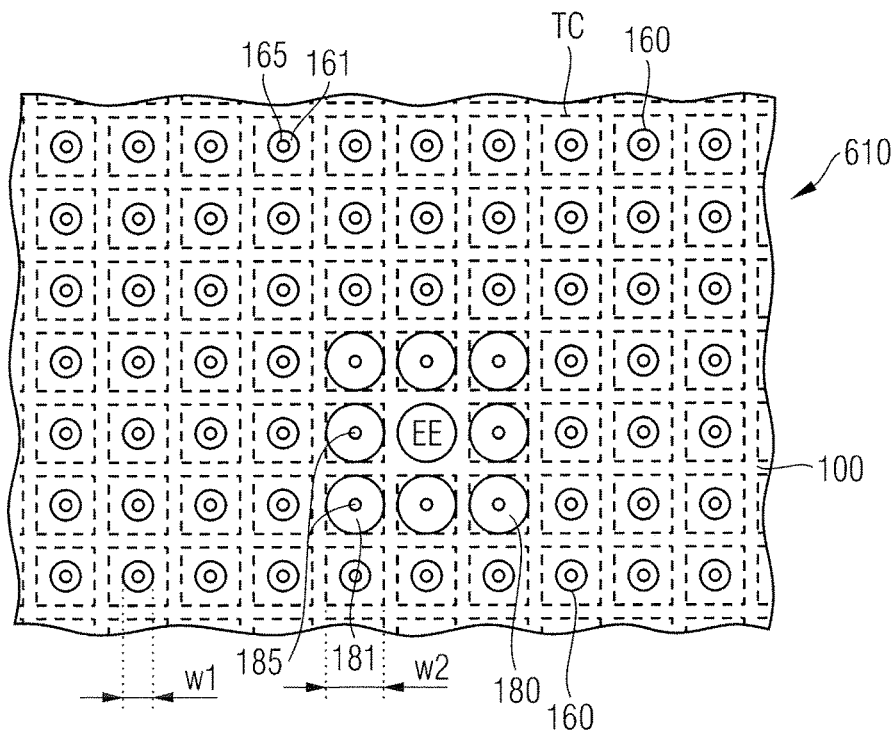
FIG. 4B is a schematic horizontal cross-sectional view of a portion of a semiconductor device according to an embodiment related to thick field dielectrics and different field electrode structure widths within a transistor cell area.

FIG. 4B differs from the embodiment of FIG. 4A in that the horizontal cross-sections of the second field electrode structures 180 are wider than the coplanar cross-sections of the first field electrode structures 160. The horizontal cross-sections of the first and second field electrode structures 160, 180 may be rotational symmetric, e.g., circular symmetric.

Figure 5:
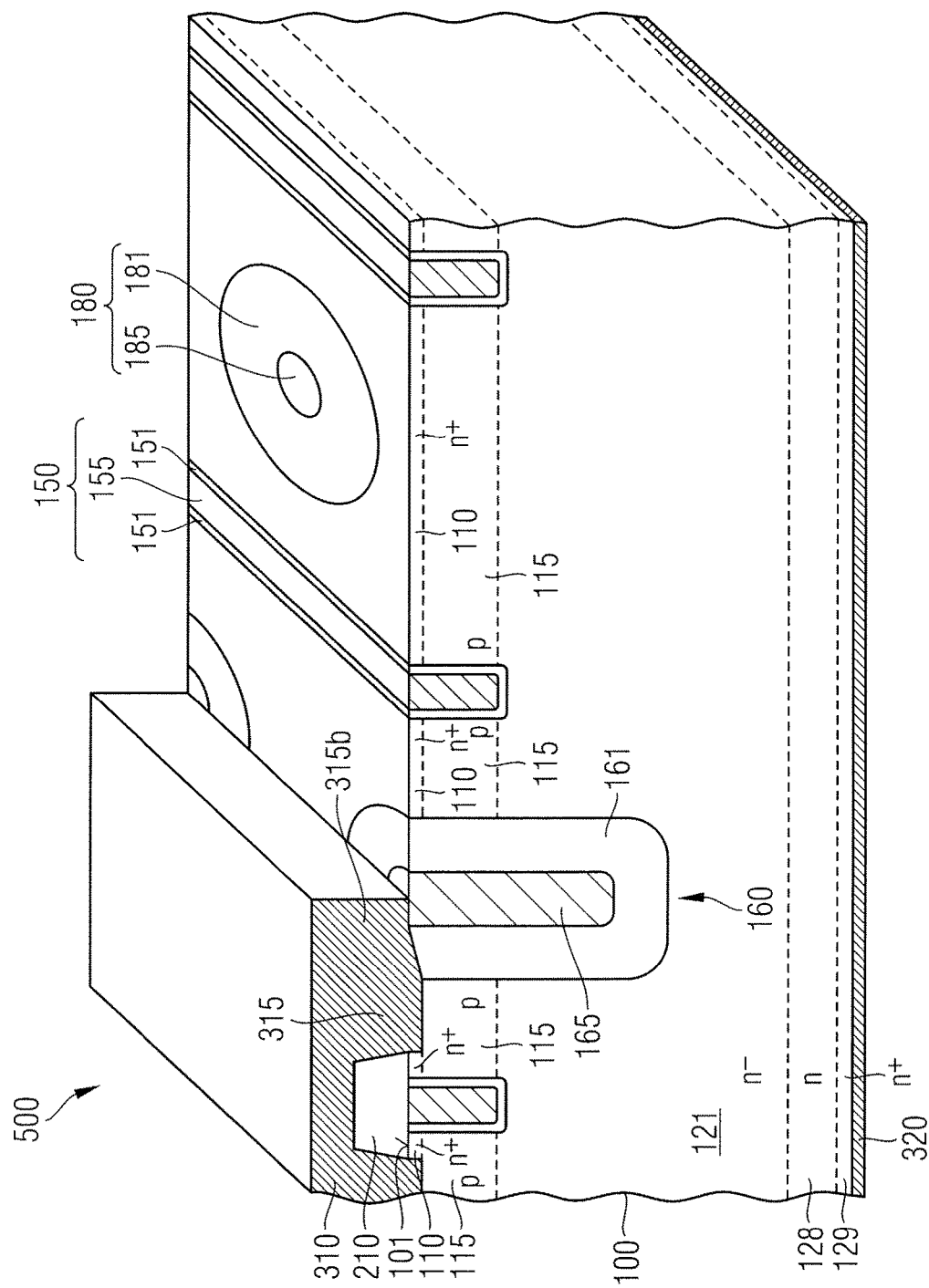
FIG. 5 is a schematic perspective view of a portion of a semiconductor device according to an embodiment related to stripe shaped gate electrodes.

The semiconductor device 500 of FIG. 5 combines needle-shaped first and second field electrodes 165, 185 with stripe-shaped gate structures 155 and stripe-shaped contact structures 315. As regards further details, reference is made to the detailed description above.

FIGS. 6A to 6D refer to a method of manufacturing a semiconductor device as described in detail with respect to the previous Figures.

FIG. 6A shows a semiconductor substrate 500a including a semiconductor layer 100a from a crystalline semiconductor material such as Si, Ge, SiGe, SiC, by way of example. The semiconductor substrate 500a may include further insulating, intrinsic or doped semiconductor layers and/or conductive layers in addition to the semiconductor layer 100a. For example, the substrate 500a may be a silicon wafer.

A mask layer is deposited on a process surface 101a of the semiconductor layer 100a and patterned by lithography to form an etch mask 710.

FIG. 6A shows the etch mask 710 on the process surface 101a of the semiconductor layer 100a. The etch mask 710 may be a homogeneous single layer or may include a layer stack of two or more different materials. According to an embodiment, the etch mask 710 includes at least one of a silicon oxide layer, a silicon nitride layer and a carbon layer. First mask openings 711 and second mask openings 712 in the etch mask 710 may have the same cross-sectional shape, wherein for non-circular cross-sectional shapes, the second mask openings 712 may be tilted with respect to the first openings, or, for non-circular and circular cross-sectional shapes, the second mask openings 712 are wider than the first mask openings 711.

A directed, anisotropic etch process forms first trenches 760 in the vertical projection of the first mask openings 711 and, contemporaneously, second trenches 780 in the vertical projection of the second mask openings 712.

FIG. 6B shows the first trenches 760 in the vertical projection of the first mask openings 711 and second trenches 780 in the vertical projection of the second mask openings 712. A vertical extension v1 of the first trenches 760 and a vertical extension v2 of the second trenches 780 may be equal in case the first and second mask openings 711, 712 have the same width. According to another embodiment, the vertical extension v2 of the second trenches 780 may be greater than the vertical extension v1 of the first trenches 760 if the width of the second mask openings 712 is greater than the width of the first mask openings 711.

A layer incorporating material of the semiconductor layer 100a may be grown on sidewalls of the first and second trenches 760, 780, wherein atoms of the semiconductor layer 100a and atoms supplied through the process atmosphere, for example oxygen or nitrogen, react with each other to form a dielectric layer 290.

Figure 6C:
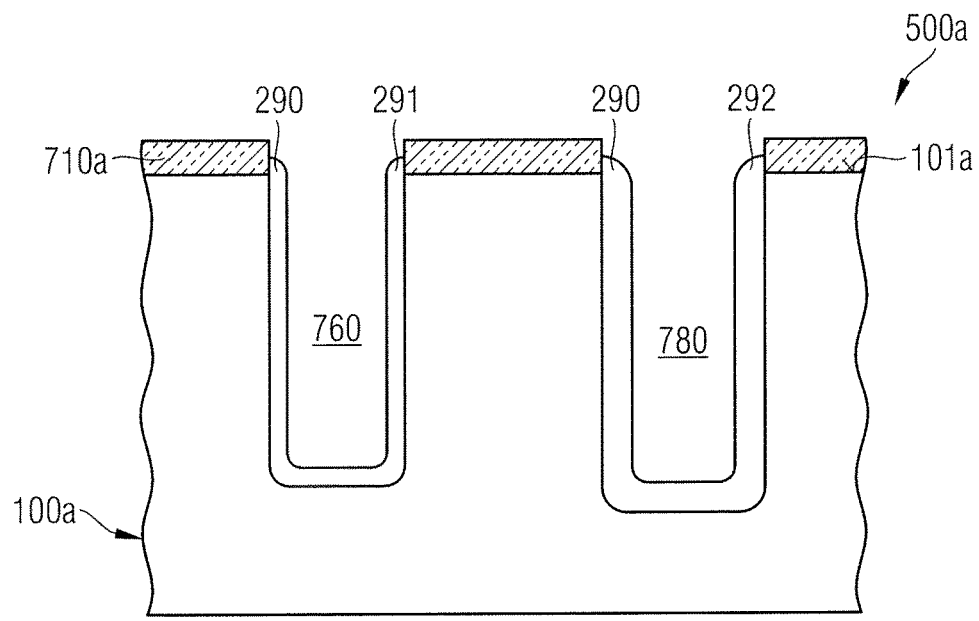
FIG. 6C is a schematic vertical cross-sectional view of the semiconductor substrate portion of FIG. 6B, after forming a dielectric layer with layer portions of different thickness in the first and second trenches.

FIG. 6C shows first layer portions 291 of the dielectric layer 290 in the first trenches 760 and second layer portions 292 of the dielectric layer 290 in the second trenches 780. The first and second layer portions 291, 292 grow contemporaneously at different growth rates. For example, the dielectric layer 290 is a silicon oxide layer grown on a silicon semiconductor layer 100a by incorporating oxygen. The growth rate changes with the current oxide thickness, wherein a difference between growth rates in the first and second trenches 760, 780 is persistently higher than typical process fluctuations. For example, in the second trenches 780 an average growth rate during the oxidation process is at least 5% higher than in the first trenches 760. Accordingly, the second portions 292 are at least 5% thicker than the first portions 291. According to an embodiment the average growth rate is at least 10% higher in the second trenches 780 than in the first trenches 760.

One or more further dielectric layers 295 may be deposited on the dielectric layer 290 and a conductive material 190 may be deposited to fill a remaining void in the first and second trenches 760, 780. Transistor cells TC may be formed in active mesa sections 171 directly adjoining first field electrode structures 160.

Figure 6D:
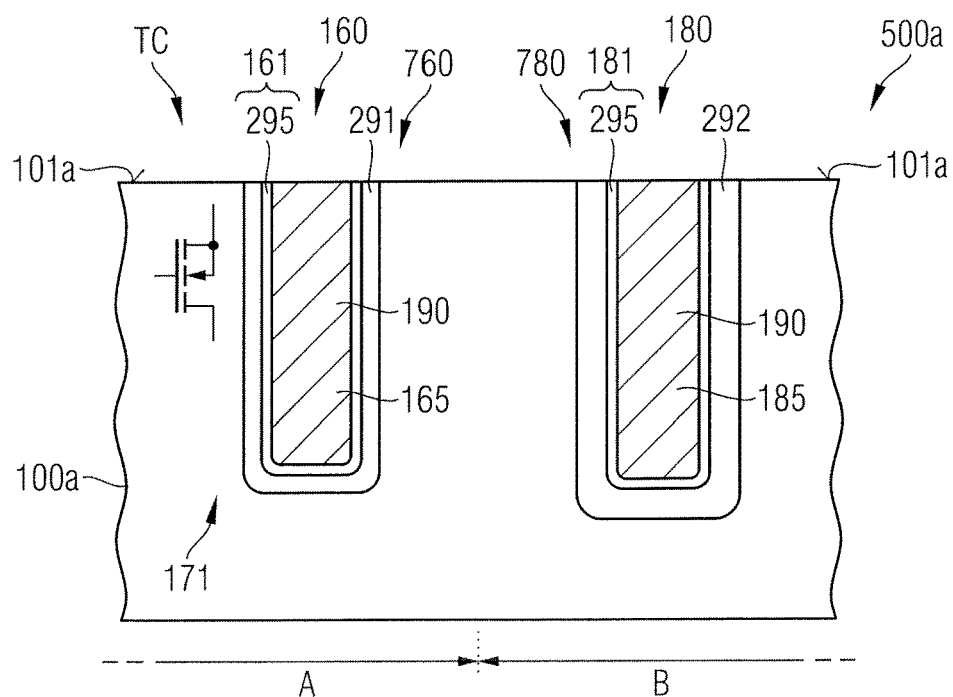
FIG. 6D is a schematic vertical cross-sectional view of the semiconductor substrate portion of FIG. 6C, after forming first and second field electrodes in the first and second trenches.

FIG. 6D shows first field electrode structures 160 with needle-shaped first field electrodes 165 formed in the first trenches 760 as well as second field electrode structures 180 with needle-shaped second field electrodes 185 formed in the second trenches 780.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
    first field electrode structures extending from a first surface into a semiconductor portion, the first field electrode structures comprising a first field dielectric layer insulating first spicular field electrodes against the semiconductor portion, the first field dielectric layer having first dielectric portions; and
    second field electrode structures extending from the first surface into the semiconductor portion, the second field electrode structure comprising a second field dielectric layer insulating second spicular field electrodes against the semiconductor portion, the second field dielectric layer having second dielectric portions, the second dielectric portions being thicker than the first dielectric portions.

2. The semiconductor device of claim 1, wherein openings of the first and second field electrode structures are rectangles with or without rounded corners.

3. The semiconductor device of claim 1, wherein the semiconductor portion comprises a transistor cell area, the transistor cell area comprising the first field electrode structures and transistor cells configured to control a current flow through the semiconductor portion.

4. The semiconductor device of claim 1, wherein the semiconductor portion comprises an edge area between the transistor cell area and an outer surface of the semiconductor portion, the edge area being devoid of the transistor cells and comprising the second field electrode structures.

5. The semiconductor device of claim 3, wherein the transistor cell area further comprises the second field electrode structures.

6. The semiconductor device of claim 1, wherein sidewalls of the first field electrode structures are formed on first crystal planes and sidewalls of the second field electrode structures are formed on second crystal planes, and wherein a first oxide growth rate on the first crystal planes differs from a second oxide growth rate on the second crystal planes by at least 5%.

7. The semiconductor device of claim 1, wherein the first field electrode structures directly adjoin {100} crystal planes of the semiconductor portion and the second field electrode structures directly adjoin {110} crystal planes.

8. The semiconductor device of claim 1, wherein a first horizontal dimension of the first field electrode structures exceeds a second horizontal dimension orthogonal to the first horizontal dimension by at most 100%.

9. The semiconductor device of claim 3, further comprising a further electronic element in the transistor cell area and adjoining the second field electrode structures.

10. The semiconductor device of claim 9, wherein the further electronic element is selected from a group consisting of current sense cells, temperature sense cells, Schottky diodes and semiconductor diodes.

11. The semiconductor device of claim 1, wherein openings of the first and second field electrode structures in the first surface have a same shape.

12. The semiconductor device of claim 1, wherein both the first and the second field electrode structures are in a transistor cell area comprising transistor cells configured to control a current flow through the semiconductor portion.

13. A method of manufacturing a semiconductor device, the method comprising:
    forming first and second trenches extending from a process surface into a semiconductor layer, wherein a first horizontal dimension of the trenches does not exceed more than 5 times a second horizontal dimension orthogonal to the first horizontal dimension; and
    heating the semiconductor layer to form a dielectric layer comprising first layer portions lining the first trenches and second layer portions lining the second trenches, wherein the second layer portions are formed thicker than the first layer portions.

14. The method of claim 13, wherein openings of the first and second trenches in the process surface have a same, non-circular symmetric shape and sidewalls of the first trenches are formed by first crystal planes and sidewalls of the second trenches are formed by second crystal planes, wherein a first oxide growth rate on the first crystal planes differs from a second oxide growth rate on the second crystal planes by at least 5%.

15. The method of claim 13, wherein sidewalls of the first trenches comprise first crystal planes of a semiconductor portion and sidewalls of the second trenches comprise second crystal planes of the semiconductor portion.

16. The method of claim 13, wherein openings of the second trenches are greater than openings of the first trenches.

17. The method of claim 13, further comprising forming transistor cells in first regions comprising the first trenches, wherein no transistor cells are formed in second regions comprising the second trenches, each second region surrounded by one of the first regions.

18. The method of claim 17, further comprising forming electronic elements different from the transistor cells in the second regions.

\* \* \* \* \*